United States Patent [19]

Fuyama et al.

[11] 4,269,899

[45] May 26, 1981

[54] SURFACE HAFNIUM-TITANIUM CARBIDE COATED HARD ALLOY AND METHOD

[75] Inventors: Moriaki Fuyama; Haruhiko Honda; Mitsuru Ura, all of Hitachi, Japan

[73] Assignee: Hitachi Metals, Ltd., Tokyo, Japan

[21] Appl. No.: 54,274

[22] Filed: Jul. 2, 1979

[30] Foreign Application Priority Data

May 22, 1979 [JP] Japan .................................. 54-63090

[51] Int. Cl.³ ............................................ B32B 15/04
[52] U.S. Cl. .................................... 428/457; 427/249;
427/399; 428/215; 428/217; 428/697; 428/698
[58] Field of Search ............... 428/539, 408, 217, 215;
427/249, 399

[56] References Cited

U.S. PATENT DOCUMENTS

| 4,035,541 | 7/1977 | Smith | 428/217 |
| 4,101,703 | 7/1978 | Schintlmeister | 428/216 |
| 4,169,913 | 10/1979 | Kobayashi | 428/217 |

Primary Examiner—Marion Mc Camish

Attorney, Agent, or Firm—Craig & Antonelli

[57] ABSTRACT

A surface coated hard alloy material suitable for use as a material of cutting tools, anti-wear parts or the like in which high wear resistance, oxidation resistance and anti-weld characteristic are the essential requisites, and a method of producing the same. The material has a substrate of cemented carbide, cermet or the like material, a first coating layer of a hafnium compound and directly coating the substrate, a second coating layer of a solid solution of a hafnium compound and a titanium compound and coating the first coating layer, and a third coating layer of a titanium compound and coating the second coating layer. These coating layers are successively formed in a common reaction system, so that the adherence between the coating layers, as well as between the first coating layer and the substrate is remarkably improved. Also, the advantages of the hafnium compound layer and the titanium compound layer are effectively utilized to provide a high wear resistance, oxidation resistance and anti-weld characteristic of the final surface coated hard alloy material.

19 Claims, 7 Drawing Figures

SURFACE HAFNIUM-TITANIUM CARBIDE COATED HARD ALLOY AND METHOD

BACKGROUND OF THE INVENTION

The present invention relates to a surface coated hard alloy material suitable for use in cutting and anti-wear parts in which a high wear resistance, oxidation resistance and anti-weld characteristic are the essential characteristics, as well as to a method of producing the same. More particularly, the invention is concerned with a surface-coated cutting tool having superior flank-wear resistance, crater-wear resistance and good adherence between the surface coating layer and the matrix metal, as well as between different layers, which in combination ensures a high cutting performance of the cutting tool, and also concerned with a method of producing such a cutting tool.

Throughout this specification, the term "hard alloy" is used to mean alloys obtained by combining one or more of carbides, nitrides and carbonitride of substances belonging to IV to VI groups of the periodic table by means of one or more of matrix metals such as Co, Ni, W, Mo and Cr, e.g. cemented carbide, cerment and so forth.

A so-called coating tip contains as its major component or base material a cemented carbide which is bonded mainly by cobalt. The base material is coated with one or more coating layers of carbide, nitride or carbonitride of a substance belonging to IV to VI groups of periodic table having a superior wear resistance to the base material, the coating layer or layers usually has a thickness of several microns. This coating tip advantageously exhibits a superior stiffness provided by the base material and a high wear resistance ensured by the surface coating layer. It is well known that this coating tip has a superior cutting performance to that of conventional tool made of cemented carbide.

Recently, however, there is an increasing demand for cutting tools having a long life and further improved cutting performance, as a result of advance and development of processed material, and various tools have been newly developed to cope with this demand. The tendency of switching over from single coating layer to multi-coating layer is an example of this development.

It is well known also that TiC (titanium carbide) coating tip and TiN (titanium nitride) coating tip are most popular among the coating tips heretofore proposed. The TiC coating tip, however, has an inferior crater-wear resistance, although it exhibits a high flank-wear resistance. It is also known that the TiN coating tip, which inherently has a lower hardness than TiC coating tip and, hence, a lower flank-wear resistance than TiC, exhibits a higher chemical stability than TiC which in turn ensures a superior crater-wear resistance. Therefore, it has been proposed to make use of the advantages of these single layers, by suitably combining these layers. For instance, Japanese Patent Laid-open Publication No. 3841/1974 discloses a coating tip having a double coating layer consisting of TiC and TiN layers. This coating tip having double coating layer possesses good flank-wear resistance provided by TiC coating layer and good crater-wear resistance provided by the TiN coating layer.

On the other hand, the cutting of cast article requires a high anti-weld characteristic of the tool. To meet this requirement, the cutting tool has to exhibit a high chemical stability particularly at high temperature. A coating tip having a double coating layer of TiC and $Al_2O_3$, formed by coating the TiC layer with aluminum oxide ($Al_2O_3$) has been proposed as in Japanese Patent Laid-open Publication No. 42029/1976, to cope with demand. In these coating tip having a double coating layer incorporating layers of carbide, nitride and oxide in laminated state, the coating layers are likely to be delaminated or separated, and unfavourable chipping is liable to occur, due to a poor adherence between laminated layers.

Various countermeasures have been proposed to overcome this problem. For instance, Japanese Laid-open Publication No. 60808/1978 proposes to interpose an intermediate layer of titanium oxycarbide TiC.O between the TiC and $Al_2O_3$ layers. Meanwhile, Japanese Patent Laid-open Publication No. 151279/1976 discloses a technique in which, after coating the cemented carbide with carbide, nitride or carbonitride, the cemented carbide with coating layers are subjected to a diffusion treatment and oxidation treatment and, finally, the coating layers are coated with $Al_2O_3$. This process is, however, too complicated and involves danger because of the use of hydrogen as the reaction gas, although it can improve the adherence between adjacent layers considerably.

Under these circumstances, the present inventors have made intense study to find out a material which exhibits a higher flank-wear resistance and crater-wear resistance, as well as higher adherence of the coating layers, than conventional commercially available coating tips.

As a result of the study, the inventors have reached a conclusion that the following items (1) to (4) are essential requisites for the coating material.

(1) To have a high hardness at high temperature.

(2) To have a coefficient of thermal expansion as close as possible to that of the substrate of tip.

(3) To have a high chemical characteristic, i.e. to have a high level of formation free energy.

(4) The cutting edge of the tip well reaches a temperature as high as 800° C. Therefore, the formed oxide of the coating film must be stable and provides a good lubrication between the cutting edge and the cut material. It is also necessary that the oxide effectively prevents diffusion of cut material into the substrate.

The above requisites (1), (2) and (3) are satisfied optimumly by a coating layer of hafnium compound such as HfC, HfN, HfC.N. For instance, the HfC coating layer exhibits a hardness of Hv1000 at 800° C., which is twice as large as that (Hv500) exhibited by the TiC coating layer at the same temperature. The HfC layer is superior to TiC coating layer also in the requisites (2) and (3).

The requisite (4) above can be most suitably met by coating layer of titanium compound such as TiC, TiN and TiC.N. The formed oxide, i.e. titanium oxide $TiO_2$ has a minute structure and, therefore, effectively prevents the cut material from being diffused into the base material of cemented carbide. Namely, it has been confirmed that the coating layer of titanium oxide provides an effective barrier.

The present inventors considered, therefore, to combine the hafnium compound and the titanium compound to obtain a coating tip which possesses both of high flank-wear resistance and crater-wear resistance.

The inventors also considered to provide an intermediate layer of solid solution of Hf.Ti compound, between the hafnium compound layer and the titanium compound layer, in order to improve the adherence of these layers. Thus, the characteristic feature of the coating film of the surface coated hard alloy material of the invention resides in that it has three layers: the hafnium compound layer, (Hf.Ti) compound solid solution layer and the titanium compound layer which are built up at a good adherence.

However, at the present stage, almost no study nor research has been made in Japan as to the HfC coating film, because it is extremely difficult to form as compared with the TiC layer. Needless to say, HfC coating tip is not available commercially at all. In the U.S. A., a coating tip having HfC coating film, making use of the technique shown in Japanese Patent Laid-open Publication No. 103848/1974 has been sold since 1971 or so. This technique is to form the HfC film by at first forming the metallic hafnium on the tip substrate by evaporation, gas decomposition, plating and the like method, and then transforming it into HfC by allowing the hafnium to react with carbon such as WC on the tip substrate, by way of a heat treatment.

This reaction is made in accordance with the chemical reaction formula shown below.

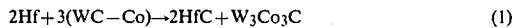

$$2Hf + 3(WC-Co) \rightarrow 2HfC + W_3Co_3C \qquad (1)$$

In this case, since the carbon on the substrate surface moves into the Hf layer, $\eta$ phase ($W_2CO_3C$) is liable to be formed on the substrate surface. This $\eta$ phase is extremely fragile and deteriorates the adherence of the film. In addition, it is extremely difficult to control the thickness of the HfC coating film, and a large fluctuation of the thickness is inevitable. For this reason, the advantage inherent in the HfC coating film cannot be effectively utilized, and the cutting tool of this type can have only little practical utility.

Hitherto, it has been attempted to form the HfC film by chemical vapor deposition (CVD) method, making use of methane, hydrogen and hafnium tetrachloride. This process is carried out by heating the base material up to a temperature above 1500° C. Therefore, this coating adversely affects the base material and deteriorates the performance of the coating tip, resulting in a limited use or application of the material. In addition, it is difficult to effect a hydrolysis of the halide of hafnium such as $HfCl_4$ as a decompositon material, so that the work is inconveniently rendered inefficient.

To overcome this problem, Japanese Patent Laid-open Publication No. 36585/1977 discloses to form a hafnium coating film. According to this process, at first a low grade hafnium halide ($HfCl_3$, $HfCl_2$, $HfCl$) is formed by making the hafnium react with hydrogen chloride and chloride gas. Then, hydrocarbon gas and a carrier gas such as $H_2$, He, Ar, Kr are introduced to effect a thermal decomposition at 900° to 1300° C., thereby to form HfC. In this method, as stated above, a low grade halide is used as the starting material, so that the high grade halide which has been generated is reduced by being passed through hafnium, or is reduced by making use of $H_2$. This process, therefore, involves a highly complicated reaction system and, in addition, suffers an inferior efficiency of work and danger due to the use of a carrier gas such as $H_2$. Further, the HfC coating film is not formed at uniform adherence.

Under these circumstances, the present inventors have developed and established an improved method of making a coating film of hafnium compound which ensures, as will be described later, a minute structure and good adherence of the coating film. According to the invention, a hafnium compound and a titanium compound are suitably combined with each other by making use of this method, so as to provide a surface coated hard alloy material which exhibits, not to mention to the advantages inherent in the hafnium and titanium compounds, a superior performance which can never be presented by the hafnium nor titanium compound solely.

Namely, the present inventors have made intense study for obtaining a surface coated hard alloy material having good wear resistance, oxidation resistance and anti-weld characteristic, particularly, a surface coated hard alloy material which has good flank-wear resistance, crater-wear resistance and good adherence between the base material and coating layer, as well as between different layers. As a result of this study, the inventors have reached a conclusion as stated below.

(i) As the first coating layer directly coating the base material or substrate, a hafnium compound layer is preferably used, in view of the following points.

(a) In order to increase the impact resistance of the surface coating material and to improve the antispalling characteristic of the coating, the first coating layer should have a coefficient of thermal expansion as close as possible to that of the base member or substrate of the hard alloy.

WC-Co system: 5.5 to $6.2 \times 10^{-6}/°C$.
HfC: $6.8 \times 10^{-6}/°C$.
TiC: $7.4 \times 10^{-6}/°C$.

(b) The first layer should have an excellent antiheat-crack characteristic and a sufficiently high stiffness, because the first layer is subjected to a bending during the use.

*It has been confirmed through a cutting test with single-coating tool (HfC or TiC), that a crack is liable to be formed in the scoop surface of the TiC coating tip.
*elastic coefficient
HFC $36 \times 10^3$ Kg/mm$^2$
TiC $32 \times 10^3$ Kg/mm$^2$ (c) The first layer has to have a sufficiently high wear resistance and a high chemical stability, as well as a high hardness at high temperature.
*hardness at 800° C.
HfC: Hv 1000
TiC: Hv 500
*$-\Delta G$ (formation free energy)
HfC: 54 Kcal/gr. atom
TiC: 44 Kcal/gr. atom (d) The first layer must be effective in preventing the movement of the carbon from the base material or substrate into the coating layers, i.e. must be effective in preventing $\eta$ phase from being formed. The $\eta$ phase is more liable to be generated in the base material or substrate by TiC film formation than by HfC film formation.

(ii) In view of the following points, a layer of solid solution of a hafnium compound and a titanium compound is preferably used as the second coating layer.

(a) The second layer has a function to relax the difference in coefficients of thermal expansion between the first and the third layers, thereby to improve the adherence between adjacent layers.

(b) The second layer has to have a wear resistance equivalent to or greater than those of the first and the third layers.

(iii) A titanium compound layer is preferably used as the third coating layer, from the following points of view.

(a) The surface of this layer is subjected to a high temperature during the use, so that an oxide is formed on the surface. This oxide is required to provide a lubrication between the cutting tool and the material which is being cut, and to prevent the latter from being diffused into the coating layer.

When a titanium compound is used as the material of the third coating layer, $TiO_2$ which is a minute rutile film is formed as the oxide. This oxide provided a high barrier effect for preventing the diffusion of the cut material into the coating layer.

The present inventors have attempted to develop a novel surface coated hard alloy material in which each of above-stated layers exhibits its own advantageous characteristics, and good adherence is ensured between the adjacent coating layers, as well as between the first coating layer and the base material or substrate, so as to provide a superior performance of the alloy.

In the course of the development of this alloy, the formation of the hafnium compound is the problem most difficult to solve. As stated before, almost no prior art exists as to the formation of the hafnium compound, and, accordingly, there is only a little example of evaluation of the wear resistance of coating film made of a hafnium compound.

SUMMARY OF THE INVENTION

It is therefoe a major object of the invention to provide a surface coated hard alloy material having a high wear resistance, oxidation resistance and antiweld characteristic, and also a method of producing the same. More specifically, the invention aims at providing a cutting tool having a multi-coating layer and having a good flank-wear resistance, crater-wear resistance and a good adherence between the coating layers as well as between the coating layer and the base material or substrate.

To this end, according to the invention, there is provided a surface coated hard alloy material having a base material or substrate made of cemented carbide, cermet or the like, a hafnium compound layer coating the base material or substrate, a layer coating the hafnium compound layer and made of a solid solution of the hafnium compound and a titanium compound, and a layer of the titanium compound coating the layer of the solid solution.

The present inventors have made various studies and researched to work out a method for producing this surface coated hard alloy material.

As a result, the inventors have found that the hafnium compound is formed easily by at first effecting a reaction of hafnium with halogen to form mainly a high grade halide and then effecting a reaction with a reaction gas such as hydrocarbon supplied into the same reaction system, under the presence of a glow discharge. It has been confirmed also that a titanium compound is formed by the same process allowing a reaction of the titanium halide with the reaction gas such as hydrocarbon. Also, the present inventors have found that the solid solution of a hafnium compound and a titanium compound can be formed by making a simultaneous use of a hafnium halide and a titanium halide as the source material gas and allowing a reaction of these halides with a reaction gas such as hydrocarbon supplied thereto, under the presence of a glow discharge.

The inventors have succeeded in developing a process in which above-stated coating reactions are successively performed in a common reaction system to form a coating tip having triple coating layers.

The formation of each coating layer basically relies upon chemical vapor deposition method (CVD method) which has been broadly used. However, the present inventors have further improved this method and worked out a method in which the coating reaction is carried out under a reduced pressure in a glow discharge including a plasma discharge. The method for forming the coating layer of the invention, therefore, is more appropriately expressed by a term LPPCVD (Low Pressure Plasma Chemical Vapor Deposition) method. Since this LPPCVD method is carried out under reduced pressure, the coating film formed by this method has a uniform and minute structure. Further, since the reaction is made in a glow discharge, the coating reaction takes place more easily and the formation rate is increased advantageously.

These and other objects, as well as advantageous features of the invention will become more clear from the following description of the preferred embodiments taken in conjunction with the accompanying drawings.

DESCRIPTION OF THE PREFERRED EMBODIMENTS

Hereinafter, a detailed description will be made as to a method of the invention for forming a surface coated hard alloy material. A reference will be made, as an example of the surface coated hard alloy material, to a HFC+(Hf.Ti)C+TiC coating, i.e. to a coating having a first coating layer of HfC, a second coating layer of solid solution of Hf.Ti)C and a third coating layer of TiC.

Figure 1:
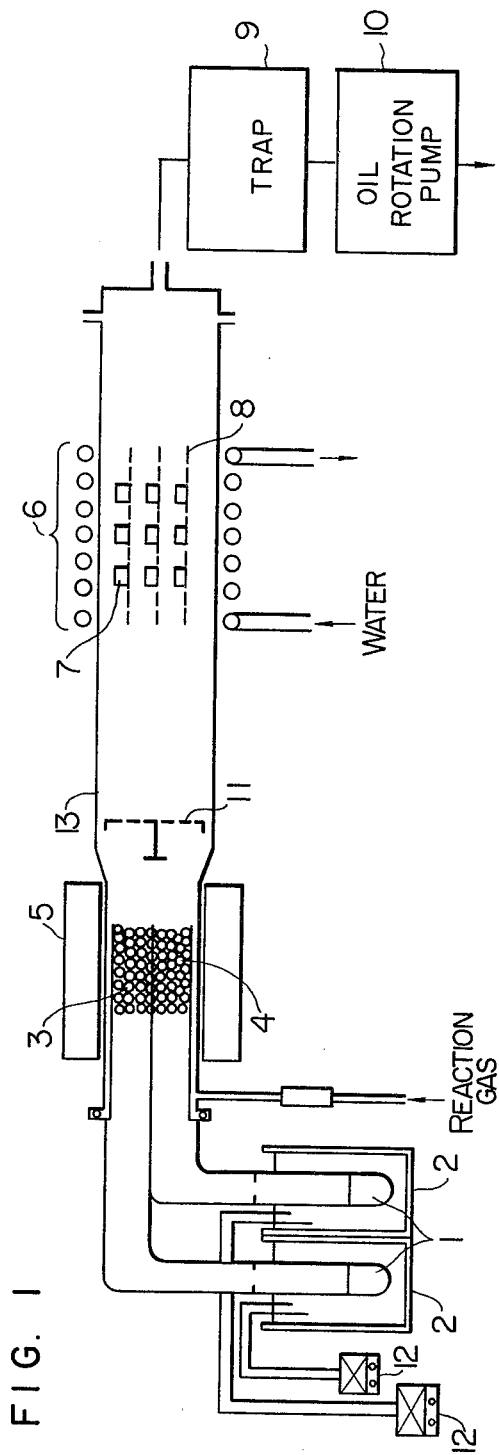
FIG. 1 is a schematic illustration of an example of a system used for carrying out the method of the invention.

FIG. 1 shows a typical example of the apparatus for carrying out the method of the invention. This apparatus has a thermostatic oven 2 adapted to maintain a constant temperature of iodine 1 and to deliver the vapor of iodine at a constant rate. A heating furnace 5 is adapted to heat hafnium 3 and titanium 4 to predetermined temperature. A high frequency induction heating furnace 6 for the substrate is adapted to conduct a reaction of $HfI_4$ to $TiO_4$ with a reaction gas such as hydrocarbon gas, nitrogen gas and ammonia gas, thereby to form hafnium compound and titanium compound. The apparatus further has a substrate holder 8 made of molybdenum and adapted to carry the substrate 8 of the hard alloy. Reference numerals 9, 10, 11, 12 and 13 denote, respectively, a trap, oil rotation pump, gas distribution plate, temperature controller and a reaction tube.

The process of forming the HfC+(Hf.Ti)C+TiC coating layer is divided into three steps: a first step of forming HfC, a second step of forming the (Hf.Ti)C solid solution and a third step of forming TiC. All steps are successively carried out in the same reaction system.

The first step of forming HfC is represented by the following reaction formula.

$$Hf + 2I_2 \rightarrow HfI_4 \quad (2)$$

$$4HfI_4 + C_4H_{10} \rightarrow 4HfC + 10HI + 3I_2 \quad (3)$$

The reaction expressed by the formula (2) above is to form hafnium tetraiodide (HfI$_4$) which is a kind of high grade hafnium halide, by supplying a predetermined amount of iodine vapor into Hf metal which has been heated up to a predetermined temperature. The formation and composition of this iodide are determined by the temperature to which the Hf metal is heated. For stably carrying out the reaction of formula (2), the heating temperature is preferably 200° to 600° C. In this example, the Hf metal was heated up to about 300° C., taking into account the simultaneous formation of the titanium iodide, as will be stated later.

The Hf metal as used preferably has a form of a sponge, more preferably a sponge of regular or uniform grain size, although the Hf metal can have other forms such as chip-like form and grains.

The Hf metal (particularly Hf sponge) used as the source contains about 1% of zirconium. The small amount of zirconium halide coexisting with the hafnium halide do not adversely affect at all the characteristic of the surface coated hard alloy material. The invention does not exclude the presence of such a trace amount of compounds of addition metal in the final product.

The amount of I$_2$ is adjusted by controlling the pressure of vapor of I$_2$ by heating the latter to make it flow into the Hf metal at a constant rate. The heating temperature of I$_2$ is optimumly 25° to 25° C. This temperature of I$_2$ affects the deposition speed of the HfI$_4$ and, therefore, is a factor for controlling the amount of formation or deposition of HfI$_4$. For obtaining a sufficient minuteness of the structure of the film, the deposition speed preferably falls in a range of between 1 and 2 μm/h. The HfI$_4$ thus formed is then brought together with a reaction gas, which is in this example butane C$_4$H$_{10}$ into contact with the substrate which has been heated up to a predetermined temperature, so that the reaction as expressed by the formula (3) takes place to form HfC. The temperature to which the substrate is heated, i.e. the reaction temperature, preferably falls within the region of between 850° C. and 1250° C. The reaction temperature lower than 850° C. cannot provide a film having wear resistance, although HfC may be formed. To the contrary, the reaction temperature exceeding 1250° C. is not recommended, because the physical properties of the substrate itself is inconveniently deteriorated, as the liquidus temperature of the substrate (WC-CO) is around 1270° C. Also, such a high reaction temperature inconveniently coarsen the crystal grain of the formed HfC film to adversely affect the (Hf.Ti)C film which is to be formed on this film.

The formation or deposition of HfC is facilitated because the reaction expressed by the equation (3) takes place in the glow discharge under reduced pressure. The HfC is thus deposited on the substrate to the desired thickness to coat the latter.

The second step of forming (Hf.Ti)C is then started. This second step is carried out by supplying I$_2$ vapor from another passage into the Ti metal which has been heated up to a predetermined temperature, while maintaining the reaction of the first step, so as to produce a titanium iodide (TiI$_4$). This reaction is expressed by the following reaction formulas (4) and (5).

$$Hf + 2I_2 \rightarrow HfI_4 \quad (4)$$

$$Ti + 2I_2 \rightarrow TiI_4 \quad (5)$$

$$4HfI_4 + 4TiI_4 + C_4H_{10} \rightarrow 4(Hf.Ti)C + 10HI + 11I_2 \quad (6)$$

The reaction of the formula (4) is made in the manner described before. For triggering the reaction of the formula (5), the temperature to which the Ti is heated preferably falls within the region of between 200° C. and 350° C. and, more preferably, about 300° C., when the simultaneous formation of hafnium iodide is taken into consideration. The separately formed HfI$_4$ and TiI$_4$ are then brought together with the reaction gas, which is in this case butane gas, into contact with substrate, so as to cause the reaction of formula (6). It is therefore possible to continuously form (Hf.Ti)C. It was confirmed that the reaction temperature for forming the HfC is sufficient for the formation of (Hf.Ti)C.

The composition of the intermediate layer of (Hf.Ti)C formed in the second step can optionally be controlled as desired. More specifically, the Hf/Ti gas concentration in the source gas can be changed by changing the amount of formation of HfI$_4$ and TiI$_4$ through controlling the amount of I$_2$ supplied into Ti and Hf, so that (Hf.Ti)C solid solution can easily be generated. This fact has been confirmed through X-ray diffraction. The (Hf.Ti)C solid solution film is thus formed to the desired thickness.

The third step of forming TiC on (Hf.Ti)C is then commenced. This step is effected simply by stopping the supply of I$_2$ vapor which is being introduced into the Hf metal. Thus, the reaction formulas for the reaction of this step are as follows.

$$Ti + 2I_2 \rightarrow TiI_4 \quad (7)$$

$$4TiI_4 + C_2H_{10} \rightarrow 4TiC + 10HI + 3I_2 \quad (8)$$

It was found that the condition for formation of the (Hf.Ti)C is directly applied to the formation of TiC. Therefore, the adherence at the boundary layer between (Hf.Ti)C and TiC is made perfect, as the introduction of I$_2$ vapor into the Hf metal is gradually decreased, after forming the (Hf.Ti)C film to the desired thickness. The I$_2$ vapor introduction is ceased after the TiC has been formed to the desired thickness, to complete the whole process.

Figure 2:
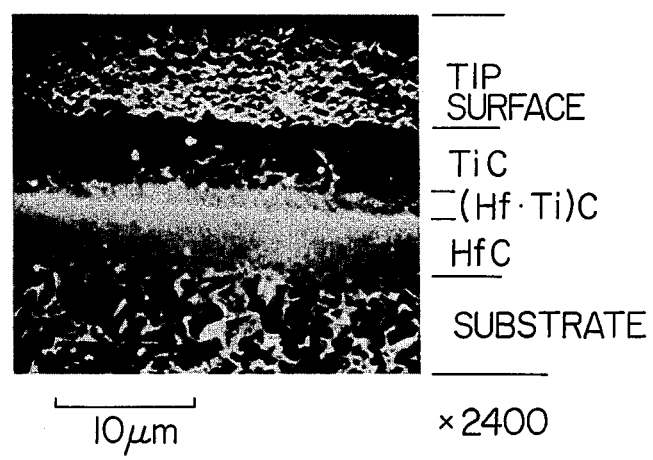
FIG. 2 is a photograph of the layer construction of a coating tip taken by a scanning electron microscope.

A scratching test with a diamond was effected on the HfC+(Hf.Ti)C+TiC coating tip formed in the manner described. No spalling was observed during the test. Also, a perfect adherence was observed between each adjacent layers of different compositions, as will be seen from FIG. 2 showing a photograph of the layer construction of the coating tip thus formed, taken by a scanning electron microscope.

In the described method of producing a surface coated hard alloy material, HfC, (Hf.Ti)C and TiC are used as the materials of the first, second and the third coating layers. These materials, however, are not exclusive. Also, the source gases HfI$_4$ and TiI$_4$ are not described in limiting sense, nor the C$_4$H$_{10}$ as the reaction gas is not exclusive.

Namely, the invention is based upon a discovery of a measure which permits a thermal decomposition of a high grade halide such as $HfI_4$, without using low grade halide such as $HfI_3$, $HfI_2$ and so forth. More specifically, the method of the invention comprises the steps of forming high grade halides as the source gases, bringing at least one of hydrocarbon, nitrogen and ammonia gas as a reaction gas into contact with the source gases, thermally decomposing the mixture gas at a predetermined temperature thereby to coat the substrate of the hard alloy with hafnium compound (HfC,HfN,HfC.N), titanium compound (TiC,TiN,TiC.N), and solid solution of hafnium compound and titanium compound [(Hf.Ti)C, (Hf.Ti)N, (Hf.Ti)C.N] and so forth.

As the high grade halide used as the source gas, iodides such as hafnium tetraiodide, titanium tetraiodide can be used more suitably than chlorides, because the latter usually exhibits a higher thermal decomposition temperature than the former. In addition, when a chloride is used, it is necessary to reduce the chloride by $H_2$ to form low grade chloride ($HfCl_3$, $TiCl_2$) before the thermal decomposition, while, in case of iodides, it is not necessary to use $H_2$. According to the invention, the use of $H_2$ as a carrier gas is not essential, although a high grade halide is used, because of the use of a glow discharge under a reduced pressure, as will be described later. The elimination of use of $H_2$ ensures the safety of the work and eliminates the disposal of waste gas.

According to the invention, high grade halides are mainly used as the source gases, and the performance of the surface coated hard alloy material is never affected even if a slight amount of low grade halide exists together with the high grade halide. The invention, therefore, does not exclude the coexistence of the high grade halide with a small amount of low grade halide.

According to the invention, the mixture gas of a source gas and a reaction gas is introduced to a substrate which has been heated up to 850° to 1250° C. so as to form coating layer.

For obtaining a good result, according to the invention, at least the first step of the three steps is carried out in two successive stages: a first stage of heating from 1050° C. to 1250° C. which causes mutual diffusion of the substrate and the first layer with each other to improve the adherence, and a second stage of heating from 850° C. to 1050° C. for forming wear resistant coating film having a minute structure and a desired thickness. A heating temperature below 1050° C. in the first stage cannot provide a sufficient adherence, while a temperature above 1050° C. in the second stage cannot provide smooth coating layer and often results in a chipping. Further, it is difficult to obtain a wear resistant coating film by a heating at a temperature below 850° C.

Preferably, the adherence between the susbstrate and the first coating film is improved at about 1100° C. and then the temperature is lowered to about 950° C. to form a minute and wear-resistant coating film having the desired thickness is formed. The second and the third coating films formed in the second and third steps are formed with good adherence between the films, because they are formed in the same reaction system as the first step. The heating temperature in the second and third steps, therefore, may be as low as about 850° C. to 1050° C.

According to the invention, the coating is effected under a reduced pressure of less than 1 Torr, because the pressure in excess of 1 Torr cannot provide minuteness nor wear resistance of the coating film. As in the case of the heating temperature, the pressure in the first step may be changed over two stages: a first stage of 0.1 to 1.0 Torr and a second stage of 0.1 Torr or less. The pressure below 0.1 Torr cannot provide a sufficient adherence between the substrate and the coating film. Therefore, the first stage is performed at a pressure of between 0.1 and 1.0 Torr, so that the adherence between the substrate and the coating film may be improved. The pressure above 0.1 Torr is liable to generate columnar grains, although it provides a sufficient adherence. The second stage, therefore, is performed to permit a uniform growth to the desired thickness, at a pressure below 0.1 Torr.

Preferably, from the view points of adherence and minuteness, the first stage is carried out at about 0.2 Torr, and the second stage is carried out at about 0.05 Torr for uniform growth of the film. The second and third steps are carried out under a reduced pressure of 0.1 Torr or less, for the same reason as the case of the previously described heating temperature. According to the invention, it is possible to uniformly coat the substrate, because the coating is carried out under a reduced pressure.

In the method of the invention, the formation of the hafnium compound and so forth is made in a glow discharge, so that a fine or minute structure of the coating layer may be formed. The glow discharge may be positively produced by combining high frequency induction heating means under reduced pressure. For instance, the glow discharge is caused at 6 kV×1.2 A under reduced pressure of 0.2 Torr. In this case, the resultant coating layer has a minute structure.

Figure 3:
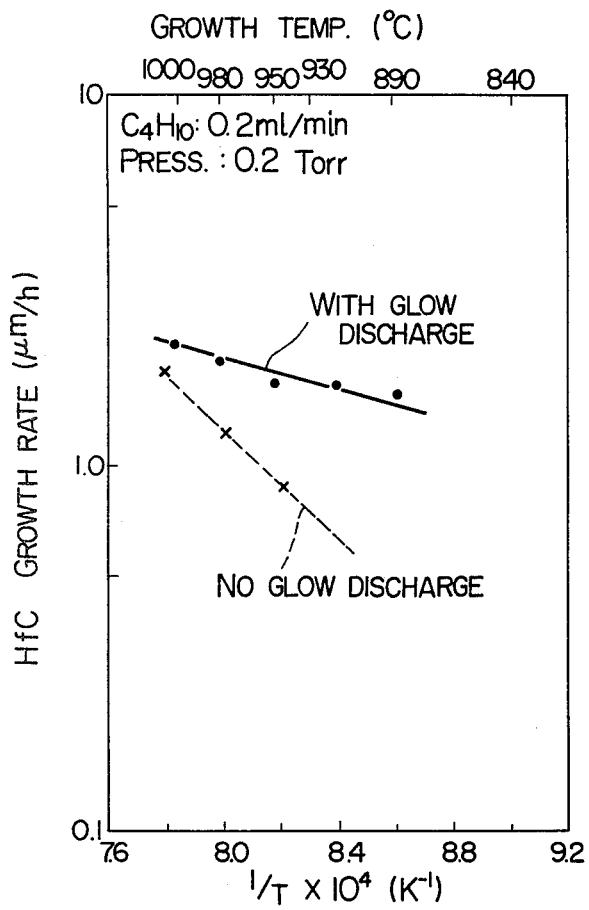
FIG. 3 is a diagram showing the rate of growth of coating film under a glow discharge.

FIG. 3 shows examples of rates of growth of HfC as observed when the glow discharge is employed and not employed during the coating operation. It will be seen that the activation energy of HfC as observed when the coating is effected under the glow discharge is 12 kcal/mol which is much smaller than that (35 Kcal/mol) observed when no glow discharge is used. It will be seen that the formation or deposition of the HfC is facilitated and the deposition speed is increased by the use of the glow discharge.

In order to make a positive use of the above-mentioned glow discharge, the induction heating system which permits a rapid heating of the substrate is preferably used as the system for heating the substrate. The induction heating also provides a high efficiency of use of the source gas, because this heating method permits the heating of only the substrate. To the contrary, the resistance heating can provide only a low efficiency of use of the source gas and, at the same time, makes the maintenance work of the reaction furnace difficult and troublesome, because this heating method allows an easy attaching of deposits on the reaction tube.

When the induction heating system is used as the heating system, it is a common measure to use an body such as quartz holder as the holder which permits a deposition over the entire surface of the substrate. The shaping and processing of this holder, however, are extremely difficult. Therefore, the inventors have considered to use a gauze wire of molybdenum. By placing the molybdenum gauze wire in parallel with the magnetic field and mounting the substrate on this gauze wire, it is possible to heat only the substrate, while avoiding the distribution of the induced power to the gauze wire, so that the substrate is coated uniformly over the entire surface thereof.

The combination of the coating films and the order of the coating with these films have been described already. The advantages of the coating films themselves, as well as the advantage of the surface coated hard alloy material are derived only when the coatings are performed in the above-described way. As to the thickness, the first hafnium compound film, second film of solid solution of hafnium compound and titanium compound and the third layer of titanium compound have thicknesses of 0.5 to 10 μm, 0.1 to 5 μm and 0.5 to 10 μm, respectively. The total thickness of all coating films is preferably 2 to 20 μm. The total thickness not greater than 2 μm cannot provide the sufficient barrier effect and fails to provide a sufficient wear resistance. To the contrary, the total thickness exceeding 20 μm tends to permit a chipping to take place in the film to reduce the wear resistance, and raises the cost impractically.

More preferably, the thicknesses of the first layer, second layer and the third layer are 2 to 3 μm, 1 to 2 μm and 2 to 3 μm, respectively. In this case, the total thickness falls within the range of between 5 and 8 μm.

As to the second film consisting of the solid solution of hafnium compound and titanium compound, it is possible to obtain a film having a high wear resistance which could never be attained solely by single film of titanium compound nor by single film of hafnium compound, when the mol % of titanium compound to hafnium compound is selected to fall within the range of between 20:80 and 80:20, more preferably 60:40.

Hereinafter, a description will be made to a triple-coated coating tip which is an embodiment of the invention. This embodiment, however, is not exclusive, and the invention can equally be applied to various cutting tools, anit-wear parts and the like which are required to have sufficient wear resistance, oxidation resistance and anti-weld characteristic.

EMBODIMENT

Figure 4:
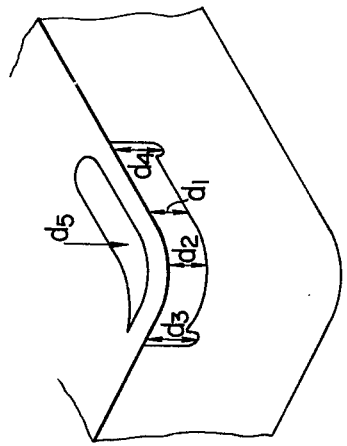
FIG. 4 illustrates various kinds of wear.

A dry cutting test was conducted to compare the performance of a conventional commercially available coating tip, reference coating tips and coating tips of the invention. A commercially available TiC coating tip was used as the example of the conventional coating tip, while coating tips having a single layer of HfC or HfN, respectively, which were formed by a specific coating method developed by the present inventors in the course of studies for accomplishing the present invention, were used as the reference coating tips. The result of this test is shown in Table 2. The cutting condition was as follows, and the shape of the tip was SNGN432EM.

material machined: JIS SCH-3 (Hs35)
cutting speed: 140 m/min.
feed: 0.3 mm/rev.
cut depth: 1.5 mm Referring to table 2, symbols $d_1$, $d_2$, $d_3$, $d_4$ and $d_5$ represent the mean flank wear, end flank wear, frong grooving flank wear, lateral grooving flank wear and crater wear, respectively, which were observed after a 60 minutes continuous cutting operation, as shown in FIG. 4.

The coating was effected successively with HfC, (Hf.Ti)C and TiC on a cemented carbide substrate of 72WC-9Co-8TiC-11TaC wt% (p30 grade) to form three successive coating layers, in accordance with the conditions as shown in Table 1. Other coated products have been treated under conditions following the conditions shown in Table 1.

It has been confirmed from lattice constant by means of an X-ray diffraction that the composition of the (Hf.Ti)C of the intermediate layer is 60TiC-40HfC (mol%).

TABLE 1

Coating conditions

| | coatings | | |
|---|---|---|---|
| | HfC | (Hf · Ti)C | TiC |
| reaction temperature °C. | 1100–950 | 950 | 950 |
| reaction pressure Torr | 0.2–0.05 | 0.05 | 0.05 |
| $C_4H_{10}$ flow rate ml/min | 0.2 | 0.2 | 0.2 |
| Hf heating temp. °C. | 300 | 300 | — |
| Ti heating temp. °C. | — | 300 | 300 |
| $I_2$ evaporation rate (Hf side) mg/min | 20 | 20 | — |
| $I_2$ evaporation rate (Ti side) mg/min | — | 7 | 16 |
| coating thickness μm | 2 | 1 | 2 |

TABLE 2

Result of dry cutting test

| | wear (mm) | | | | |
|---|---|---|---|---|---|
| coatings | $d_1$ | $d_2$ | $d_3$ | $d_4$ | $d_5$ |
| A  TiC (5 μm) | 0.16 | 0.31 | 0.26 | 0.20 | 0.17 |
| B  HfC (5 μm) | 0.07 | 0.12 | 0.305 | 0.41 | 0.05 |
| HfN (5 μm) | 0.075 | 0.12 | 0.31 | 0.42 | 0.045 |
| C  HfC + (Hf · Ti)C + TiC 2 μm   1 μm   2 μm | 0.075 | 0.17 | 0.22 | 0.16 | 0.065 |
| HfN + (Hf · Ti)N + TiN 2 μm   1 μm   2 μm | 0.070 | 0.15 | 0.25 | 0.20 | 0.060 |

A: conventional coating tip,
B: reference coating tips,
C: coating tips of invention:
$d_1$: mean flank wear,
$d_2$: end flank wear,
$d_3$: front grooving flank wear,
$d_4$: lateral grooving flank wear,
$d_5$: crater wear (maximum depth)

From Table 2, it will be understood that the coating tips of the invention has a superior groovingwear resistance to the conventional TiC coating tip, and exhibits a high mean flank wear resistance, end flank wear resistance, and crater wear resistance. Thus, the coating tip of the invention has a high quality and exhibit a stable superior performance.

It will be also seen that the coating tips of the invention exhibits a superior performance to the reference coating tips which are superior to the conventional TiC coating tip in mean flank wear resistance, end flank wear resistance and crater wear resistance, but are rather inferior to the same in grooving wear resistance. A scratching test was conducted before turning to the dry cutting test, in order to examine the adherence of coating films in the coating tips of the invention, and a good adherence was confirmed as a result of this test.

Figure 5:
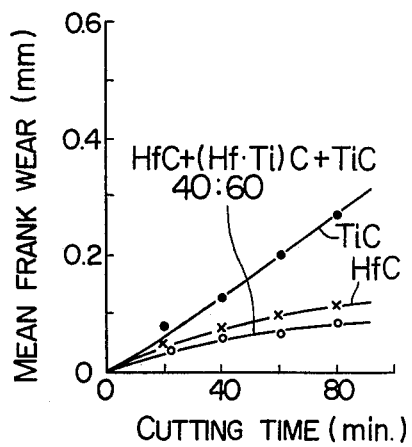
FIG. 5 to 7 show, respectively, how the mean flank wear, front grooving flank wear and crater wear are changed as the cutting time grows long.
Figure 6:
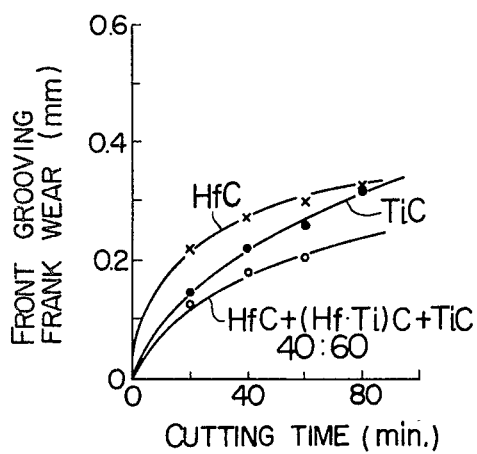
Figure 7:
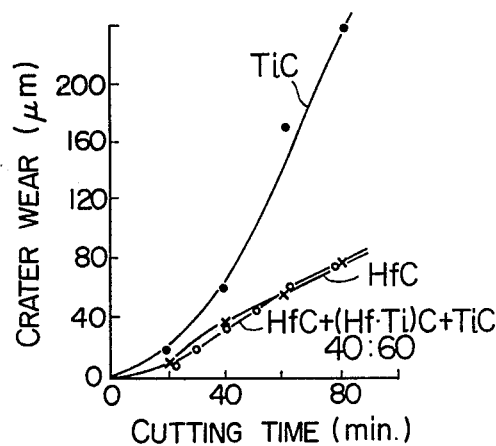

FIGS. 5 to 7 show how the mean flank wear, front grooving flank wear and the crater wear are changed in relation to time, for each of the TiC coated conventional tool, reference tool having HfC coating layer and the tool of the invention having the HfC+(Hf.Ti)C+-TiC coating.

From these Figures, it will be understood that the coating tip of the invention is much superior to the conventional and reference coating tips.

As a result of a dry and wet cutting test conducted on a JIS SCM3 as the material machined, the coating tip of the invention exhibits a tool life which is about twice as long as that of the conventional TiC coating tip. It has also been confirmed that the coating tip of the invention exhibits a much higher superiority to the conventional one, when a cast material (FCD 50) is used as the material machined.

Although the invention has been described with specific reference to a surface coated cutting tool, needless to say, the invention can equally be applied to various other materials or parts such as anti-wear parts which are required to have a sufficient wear resistance, oxidation resistance and anti-weld resistance.

What is claimed is:

1. A surface coated hard alloy material comprising: a substrate made of a cemented carbide, cermet or the like material; a first coating layer constituted by a film of a hafnium compound and coating said substrate; a second coating layer constituted by a film of solid solution of a hafnium compound and a titanium compound and coating said first coating layer; and a third coating layer constituted by a film of a titanium compound.

2. A surface coated hard alloy material as claimed in claim 1, wherein said hafnium compound is one or more of hafnium carbide HfC, hafnium nitride HfN and hafnium carbonitride HfC.N, said titanium compound is one or more of titanium carbide TiC, titanium nitride TiN and titanium carbonitride TiC.N, and said solid solution is one or more of hafnium-titanium carbide (Hf.Ti)C, hafnium-titanium nitride (Hf.Ti)N and hafnium-titanium carbonitride (Hf.Ti)C.N.

3. A surface coated hard alloy material as claimed in claim 1, wherein the thicknesses of said first, second and third coating layers are 0.5 to 10 $\mu$m, 0.1 to 5 $\mu$m and 0.5 to 10 $\mu$m, respectively, and the total thickness of these coating layers falls within the region of 2 to 20 $\mu$m.

4. A surface coated hard alloy material as claimed in claim 1, wherein said hafnium compound constituting said first coating layer is the hafnium carbide HfC, said solid solution constituting said second coating layer is the hafnium-titanium carbide (Hf.Ti)C, and said titanium compound constituting said third coating layer is titanium carbide TiC.

5. A surface coated hard alloy material as claimed in claim 4, wherein the mol% of HfC to TiC of said hafnium-titanium carbide (Hf.Ti)C falls within the range of between 20:80 and 80:20.

6. A surface coated hard alloy material as claimed in claim 4, wherein said hafnium carbide constituting said first coating layer, said hafnium-titanium carbide constituting said second coating layer and said titanium carbide constituting said third coating layers have thicknesses of about 3 $\mu$m, about 1 $\mu$m and about 3 $\mu$m, respectively, and the mol ratio of HfC to TiC of said hafnium-titanium carbide is about 40:60.

7. A surface coated hard alloy material as claimed in claim 1, characterized in that said surface coated hard alloy material is formed by forming said hafnium compound, said solid solution of said hafnium compound and said titanium compound, and said titanium compound successively on said substrate in a common reaction system, in a glow discharge under a reduced pressure, by at first forming mainly high grade halides, introducing at least one of hydrocarbon gas, nitrogen gas and ammonia gas, passing the mixture gas to said substrate which has been heated by an induction heating.

8. A surface coated hard alloy material as claimed in claim 1, characterized in that said material is used as a material of a multi-coated cutting tool.

9. A method of producing a surface coated hard alloy material characterized in that the following three steps are successivly carried out in a common reaction system:

(i) a first step which consists in forming mainly a high grade hafnium halide (source gas), introducing at least one of hydrocarbon gas, nitrogen gas and ammonia gas as the reaction gas into said source gas, bringing the mixture gas to a substrate of said hard alloy material which has been heated up to 850° C. to 1250° C. so as to coat said substrate with said hafnium compound under a reduced pressure of not higher than 1 Torr and in the presence of a glow discharge;

(ii) a second step which consists in forming mainly a high grade hafnium halide and a high grade titanium halide (source gas), introducing at least one of hydrocarbon gas, nitrogen gas and ammonia gas as the reaction gas into said source gas, introducing the mixture gas to said substrate which has been heated up to 850° C. to 1250° C. so as to coat said hafnium compound formed in said first step on said substrate with a solid solution of said hafnium compound and said titanium compound, under a reduced pressure of not higher than 1 Torr and in the presence of a glow discharge; and (iii) a third step which consists in forming mainly a high grade titanium halide (source gas), introducing at least one of hydrocarbon gas, nitrogen gas and ammonia gas as the reaction gas, introducing the mixture gas to said substrate which has been heated up to 850° C. to 1250° C. so as to coat said solid solution of said hafnium compound and said titanium compound, which has been formed in said second step, with a titanium compound under a reduced pressure of not higher than 1 Torr and in the presence of a glow discharge.

10. A method of producing a surface coated hard alloy material as claimed in claim 9, wherein said high grade hafnium halide and said high grade titanium halide are hafnium tetraiodide $HfI_4$ and titanium tetraiodide $TiI_4$, respectively.

11. A method of producing a surface coated hard alloy material as claimed in claim 9, wherein the heating is effected by a high frequency induction heating.

12. A method of producing a surface coated hard alloy material as claimed in claim 9, wherein said reaction gas is the hydrocarbon gas.

13. A method of producing a surface coated hard alloy material as claimed in claim 9, wherein said first step is conducted in two stages: a first stage in which the heating temperature is 1050° C. to 1250° C. and a second stage in which the heating temperature is 850° C. to 1050° C.

14. A method of producing a surface coated hard alloy material as claimed in claim 9, wherein said reduced pressure in said first step is formed in two stages: a first stage of 0.1 to 1.0 Torr and a second stage of less than 0.1 Torr.

15. A method of producing a surface coated hard alloy material as claimed in claim 9, wherein said hafnium compound is one or more of hafnium carbide HfC, hafnium nitride HfN and hafnium carbonitride HfC.N, said solid solution is one or more of hafnium-titanium carbide (Hf.Ti)C, hafnium-titanium nitride (Hf.Ti)N and hafnium-titanium carbonitride (Hf.Ti)C.N, and said titanium compound is one or more of titanium carbide TiC, titanium nitride TiN and titanium carbonitride TiC.N.

16. A method of producing a surface coated hard alloy material as claimed in claim 9, wherein said substrate is placed on a substrate holder which is constituted by a gauze wire set to extend in parallel with the magnetic field.

17. A method of producing a surface coated hard alloy material as claimed in claim 9, wherein hafnium and a halogen are made to react with each other at a temperature of 200° C. to 600° C. to form mainly a high grade hafnium halide, and titanium and a halogen are made to react with each other at a temperature of 200° C. to 350° C. to form mainly a high grade titanium halide.

18. A method of producing a surface coated hard alloy material as claimed in claim 9, wherein the following steps are carried out successively in a common reaction system:
(i) a first step which consists in forming mainly hafnium tetraiodide $HfI_4$ as a source gas, introducing at least one of hydrocarbon gas, nitrogen gas and ammonia gas as the reaction gas, and introducing the mixture gas to said substrate of said hard alloy which is heated in a first stage to 1050° C. to 1250° C. and in a second stage to 850° C. to 1050° C. by a high frequency induction heating means, said first and second stages of heating being made under a reduced pressures of 0.1 to 1.0 Torr, and below 0.1 Torr, respectively, so as to coat said substrate with a hafnium compound in the presence of a glow discharge;
(ii) a second step which consists in forming mainly hafnium tetraiodide $HfI_4$ and titanium tetraiodide $TiI_4$ as source gases, introducing at least one of hydrocarbon gas, nitrogen gas and ammonia gas as the reaction gas, and introducing the mixture gas into said substrate which has been heated to 850° C. to 1050° C. by said high frequency heating means, so as to coat said hafnium compound, which has been formed in said first step, with a solid solution of said hafnium compound and said titanium compound under a reduced pressure of not higher than 0.1 Torr in the presence of a flow discharge; and
(iii) third step which consists in forming mainly the titanium tetraiodide $TiI_4$ as the source gas, intorducing at least one of hydrocarbon gas, nitrogen gas and ammonia gas into said soucce gas, and introducing the mixture gas to said substrate which has been heated to 850° C. to 1050° C. by said high frequency induction heating means so as to coat said solid solution of said hafnium compound and said titanium compound, which has been formed in said second step, with the titanium compound under a reduced pressure of not higher than 0.1 Torr in the presence of a glow discharge.

19. A method of producing a surface coated hard alloy material as claimed in claim 18, characterized in that the mol% of said HfC to said TiC in said solid solution is adjusted to fall within the range of between 20:80 and 80:20, by adjusting the rate of supply of mainly said hafnium tetraiodide $HfT_4$ and titanium tetraiodide $TiI_4$ as the source gases in said second step.

* * * * *